Nov. 4, 1969 J. EIGEMAN ET AL 3,476,990

HOUSING AND LEAD STRUCTURE FOR HIGH FREQUENCY
SEMICONDUCTOR DEVICE OPERATION

Filed April 12, 1967 5 Sheets-Sheet 1

INVENTORS
JACOBUS EIGEMAN
ANTON DIRK TUINHOF
BY
Frank R. Trifari
AGENT

INVENTORS
JACOBUS EIGEMAN
ANTON DIRK TUINHOF
BY
AGENT

Nov. 4, 1969 J. EIGEMAN ET AL 3,476,990
HOUSING AND LEAD STRUCTURE FOR HIGH FREQUENCY
SEMICONDUCTOR DEVICE OPERATION
Filed April 12, 1967 5 Sheets-Sheet 3

INVENTORS
JACOBUS EIGEMAN
ANTON DIRK TUINHOF
BY
[signature]
AGENT

INVENTORS
JACOBUS EIGEMAN
ANTON DIRK TUINHOF
BY
Frank R. Trifari
AGENT

INVENTORS
JACOBUS EIGEMAN
ANTON DIRK TUINHOF
BY
Frank R. Trifari
AGENT

United States Patent Office 3,476,990

Patented Nov. 4, 1969

3,476,990

HOUSING AND LEAD STRUCTURE FOR HIGH FREQUENCY SEMICONDUCTOR DEVICE OPERATION

Jacobus Eigeman and Anton Dirk Tuinhof, Mollenhutseweg, Nijmegen, Netherlands,, assignors to U.S. Philips Corporation, New York, N.Y., a corporation of Delaware Filed Apr. 12, 1967, Ser. No. 630,409
Claims priority, application Netherlands, Apr. 14, 1966, 6604964, 6604965; Mar. 18, 1967, 6704097
Int. Cl. H01l *11/02, 15/06*
U.S. Cl. 317—235 16 Claims

ABSTRACT OF THE DISCLOSURE

A lead or connection pin structure for a semiconductor device wherein an interior end portion of one of the leads has two parts, one of which receives a wire connection from the semiconductor, and the other of which extends between the semiconductor and the other lead. When that one lead is connected so as to be common to the other two leads representing the input and output of the device, an electrical screening action results which reduces substantially the feedback capacitance increasing the high frequency performance. The lead end geometry can be arranged so that all the connections extend in the same plane and in a straight line simplifying assembly.

Figure 1:
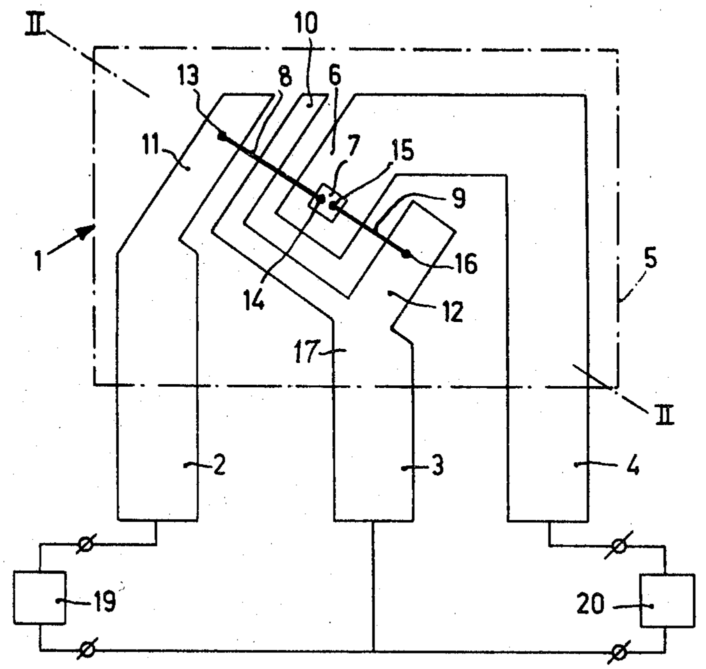

The invention relates to a semiconductor device comprising a semiconductor body inside an envelope in which at least three connection pins are passed through the wall of the envelope, the semiconductor body which is provided with electrodes being secured, through one of its electrodes, to an end portion of one of the said connection pins, hereinafter termed the supporting connection pin, two further electrodes of the semiconductor body being connected, through connection conductors, to the two further connection pins which extend to the proximity of the semiconductor body, one of the two further connection pins comprising a part which is located between the end portion of the supporting connection pin and a part of the other further connection pin.

The invention further relates to circuit arrangements which comprise such a semiconductor device.

It is to be noted that in this connection the wall of the envelope is to be understood to mean not only the wall of a hollow envelope, but also the surface of a solid envelope for example, a solid envelope of synthetic material.

It has been found that when using such a semiconductor device in circuit arrangements, the favourable properties of the circuit element which is realized in the semiconductor body often cannot be used to full advantage, because in circumstances less favourable properties of the remaining parts of the semiconductor device play too large a part. Some of these annoying properties are the capacities which may occur between the various connection pins. In circuit arrangements in which one of the connection pins is common for the electric input and for the electric output of the semiconductor device, the capacity which occurs between the connection pin to which the electric signals are applied and the connection pin from which the electric signals are derived may cause a disturbing feedback coupling between the electric input and the electric output of the semiconductor device. For example, when a transistor is used in such a circuit arrangement, for example, a common emitter circuit or a common base circuit, for amplifying electric signals, the possible amplification which can be obtained with the said circuit can be restricted by the said capacity which causes feedback coupling.

In order to reduce said capacity which causes feedback coupling between the connection pins, it has already been proposed to use three straight, parallel juxtaposed connection pins in which the central connection pin may be used to screen the two outermost pins from one another. For that purpose the central connection pin is connected to the electrode of the semiconductor body which in the circuit is common for the input circuit and for the output circuit of the semiconductor device. For example, in transistors for use in common emitter circuits, the emitter, and in transistors for use in common base circuits, the base, is connected to the central connection pin.

The result of this screening is that instead of the capacity which causes the feedback coupling between the two outermost connection pins, which are substantially entirely avoided, capacities occur between each of the outermost connection pins and the central connection pin. The two latter capacities occur at the input and at the output, respectively, of the semiconductor device and in most circuits are not annoying or are annoying at least to a considerably smaller extent.

As already stated in the preamble the semiconductor body is often secured, through one of its electrodes, to the supporting connection pins. The last-mentioned electrode usually is not the electrode which in a circuit is common for the input circuit and the output circuit. In that case the two further connection pins consequently are located beside each other on the same side of the supporting connection pin. However there are various reasons why it may be desirable that the two further connection pins extend on opposite sides of the semiconductor body. For example, in the latter case the connection conductors which connect the further electrodes of the semiconductor body to the further connection pins may both be constructed so as to have a very short length which may be of importance for the behaviour of the semiconductor device at high frequencies, inter alia in connection with induction phenomena. In addition, when the two connection conductors of the semiconductor body to the further connection pins extend in the same direction it may easily occur that the connection conductors touch each other so that a short circuit occurs. In addition it may be highly desirable, from a point of view of manufacture, that the connection conductors extend spacially in approximately opposite directions. In fact, this enables the four connection points of the two connection conductors to be located substantially on a straight line. It has been found that four connection points which are located substantially on a straight line can often be mass-produced more rapidly and consequently more cheaply than four connection points which are not located on a straight line.

In order to meet these requirements it has already been proposed to bend the end portion of the supporting connection pin around the extremity of the central connection pin, the one further connection pin, the extremity of the supporting connection pin becoming located between the end portions of the two further connection pins.

However, in this case, the end of the supporting connection pin is no longer screened from the other further connection pin by the one further connection pin. As a result of this the capacity which causes feedback coupling is again increased.

The capacity which causes feedback coupling has also been reduced already in a different manner, namely by using connection pins which extend in different directions, instead of connection pins which are located beside each other. For example, semiconductor devices are known in which two connection pins extend approximately in opposite directions while a third connection pin is arranged at right angles to said pin. However, it will be obvious that in these cases also further screening is of importance because in fact the end portions of the connection pins extend to the proximity of each other.

The invention is based inter alia on the recognition of the fact that it is possible, with a comparatively simple configuration of connection pins, to avoid the drawbacks of the above-described configurations and the invention consequently has for its object to provide such a simple configuration of connection pins.

According to the invention, a semiconductor device of the type mentioned in the preamble is characterized in that in addition to the intermediate part already mentioned which has an electrically screening action, a second part is associated with the one further connection pin, which second part is located opposite to the intermediate part beside the end portion of the supporting connection pin and to which is connected the connection conductor which connects the one further connection pin to a further electrode of the semiconductor body, the said two parts being united inside the envelope.

It will be clear that this configuration in which the end portion of the supporting connection pin is located between two parts of the one further connection pin gives in a simple manner a good screening of the supporting connection pin and the other further connection, while it is not necessary for the two connection conductors of the semiconductor body to the further connection pins to extend in the same direction.

The connection conductors will preferably even extend approximately in opposite directions, as a result of which the connection points of the connection conductors to the further connection pins and to the further electrodes of the semiconductor body, viewed in a direction at right angles to the largest cross-section of the semiconductor body, are located substantially on a straight line.

An important advantage of this location of the connection points is that in mass production four connection points located on a straight line can be manufactured more rapidly and consequently more cheaply than four connection points which are not located on a straight line.

A semiconductor device according to the invention preferably is characterized in that the supporting connection pin, at least the two parts of the one further connection pin which are located on opposite sides beside the end portion of the supporting connection pin, and the other further connection pin are intersected substantially throughout their length inside the envelope by a common plane of intersection.

It has been found that from a point of view of manufacture it has advantages if the connection pins are located in a common plane as much as possible while in addition a very good screening is obtained.

Alternatively, the directions in which the supporting and the further connection pins are passed through the wall of the envelope may be parallel to the same plane. For clearness' sake it is to be noted that if reference is made herein to directions in which the connection pins are passed through the wall of the envelope the said directions are all considered in a corresponding manner, that is to say either all of them from within the envelope to outside the envelope or conversely all of them from outside the envelope to within the envelope.

The connection pins may be in the form of a wire, in which these filamentary connection pins are flattened at least at the area where the semiconductor body and the connection conductors are secured thereto, while the large connection surfaces of the flattened parts of the connection pins are located substantially in one plane. These filamentary connection pins which are comparatively cheap can easily be bent in any desired direction while the semiconductor device can in addition be accommodated in electric circuit arrangements by means of the normally used standardized sockets which are adapted to circular connection pins.

The flattened parts of the connection pins render the connection of the semiconductor body and the connection conductors to the connection pins possible in a simple manner.

A further embodiment of a semiconductor device according to the invention is characterized in that the connection pins are metal strips the large surfaces of which, at least in as far as the connection pins have a common plane of intersection, are substantially parallel to said plane of intersection.

The connection pins can simply be manufactured simultaneously from one metal sheet, while, for example, the connection pins may initially be connected together by connection strips which can be removed in a later stage of the manufacture.

It will be obvious that the invention may be applied to many semiconductor devices, for example, to field-effect transistors which have or do not have an insulated gate electrode. The invention is of particular importance for transistors having an emitter, a base and a collector connection in which the semiconductor body is connected to the supporting connection pin via the collector, while the base and the emitter of the semiconductor body are each connected, through the connection conductors, to one of the further connection pins, in particular when the said transistors are destined for use in common emitter or common base arrangements.

The semiconductor body may be, for example, that of a planar transistor, a mesa-transistor or an alloy-diffusion transistor which is connected in normal manner to the supporting connection pin, in this case the collector pin. The connection conductors may be connected to alloyed or vapor-deposited emitter and base contacts. In transistors which are destined for use in common emitter circuits, the emitter, and in transistors which are destined for use in common base circuits, the base of the semiconductor body is connected to the one further connection pin.

In an important preferred embodiment the connection pins are passed through the wall of the envelope substantially in the same direction.

In addition the invention is of particular importance for transistors which are embedded in an envelope of synthetic material. It has been found that the possible amplification which can be obtained with such a transistor is smaller than that of a transistor of the same type but having a metal envelope which can be evacuated or is filled, for example, with an inert gas.

The invention is based inter alia on the recognition that this is due inter alia to the fact that the dielectric constant of the synthetic material of the envelope is larger than that of an inert gas or of a vacuum and that consequently the capacity causing feedback coupling which restricts the possible amplification likewise is larger in the case of an envelope of synthetic material.

Nevertheless the use of a transistor having an envelope of synthetic material in which the transistor is embedded is desirable since a transistor having an envelope of synthetic material may be considerably cheaper than a transistor having a metal envelope or having an envelope of an insulating material, for example, ceramic material, which is filled with a gas, possibly under a reduced pressure.

An important embodiment of a transistor according to the invention having a semiconductor body which is secured to a connection pin, the supporting connection pin, hereinafter termed collector pin, while two further connection pins which are connected to the emitter and the base, respectively of the transistor by connection conductors extend to the proximity of the semiconductor body, the semiconductor body being embedded in a synthetic material and the connection pins projecting from said synthetic material only partly and the envelope of the transistors exclusively consisting of said synthetic material, consequently is characterized in that inside the envelope of synthetic material a screening conductor is present which is connected to one of the further connection pins and extends between the other further connection pin and the collector pin.

A very favorable configuration of such a transistor is characterized in that the connection pins inside the envelope of synthetic material extend beside each other from a surface of the envelope of synthetic material, the one further connection pin being located between the other further connection pin and the collector pin, the collector pin being bent around the end (the second part) of the one further connection pin, the end portion of the collector pin which supports the semiconductor body being located between the two further connection pins, the screening conductor (the intermediate part of the one further connection pin) extending from the one further connection pin to between the said end portion of the collector pin and the other further connection pin.

A more general favorable configuration in which the one further connection pin has a screening action between the supporting connection pin and the other connection pin for the greater part of its length inside the envelope is characterized in that inside the envelope the one further connection pin is divided into two branches, one branch comprising the intermediate part and the other branch comprising the second part of the one further connection pin, the supporting connection pin being bent around the other branch the end portion of the supporting connection pin being located between the two branches of the one further connection pin, the part of the one further connection pin not associated with the branches being located, at least for part of its length, between the supporting connection pin and the other further connection pin and being passed through the wall of the envelope. The separate screening branch which does not convey current may be narrow so that the connection conductor which connects the semiconductor body to the other further connection pin may have a short length, if desired.

A satisfactory screening may alternatively be achieved with another simple configuration of connection pins, and a further embodiment of a semiconductor device according to the invention in which at least the two parts of the one further connection pin which are located on opposite sides beside the end portion of the supporting connection pin and the other further connection pin are intersected inside the envelope substantially throughout their length by a common plane of intersection, is characterized in that the intermediate part of the one further connection pin comprises an extension on one side which is passed through the wall of the envelope, and comprises an extension on the opposite side which is intersected entirely by the common plane of intersection and which is bent around the end portion of the supporting connection pin, this also forming the second part of the one further connection pin.

It will be obvious that in this embodiment a satisfactory screening is obtained by means of one bent connection pin without an additional screening conductor while in addition the connection conductors may be approximately in alignment. In addition, as a result of the extension which is bent around the end portion of the supporting connection pin, the supporting connection pin is screened somewhat better while the supporting connection pin in this case may be comparatively short so that the surface of said connection pin which also determines the remaining capacitive cross-talk, is comparatively small.

In semiconductor devices which are specially destined for use at very high frequencies it has already been proposed to reduce the capacities between the connection pins by passing the connection pins not in the same direction but in different directions through the wall of the envelope. As was already noted before, the invention may advantageously be used in this case also because exactly at very high frequencies a good screening becomes more important and such a semiconductor device is characterized according to the invention in that the direction in which the one further connection pin is passed through the wall of the envelope is approximately at right angles to the directions in which the supporting connection pin and the other further connection pin are passed through the wall of the envelope.

The expression "approximately at right angles to" should be interpreted to have a wide meaning so that it includes, for example, configurations in which the connection pins enclose angles two by two of approximately 120°. From a point of view of manufacture, however, two connection pins which extend substantially in opposite directions, will preferably be combined with a third connection pin which extends substantially at right angles to said directions, because such a configuration generally is more favourable in electrical respects and in addition often gives a smaller loss of material.

Preferably a semiconductor device of the last-mentioned type according to the invention is characterized in that the one further connection pin is divided inside the envelope into two branches one branch comprising the intermediate part and the other branch comprising the second part of the one further connection pin extending to between the two branches and the other further connection pin extending to beside the intermediate part.

A further favourable configuration of a semiconductor device according to the invention employing a transistor having a connection pin, the supporting connection pin, hereinafter termed the collector pin, which is passed through the wall of the envelope and to which the semiconductor body is secured in the proximity of the extremity of the collector pin through the collector, and in which two further connection pins are passed through the wall of the envelope which extend approximately in opposite directions from the wall to in the proximity of the end of the collector pin and which are connected by connection conductors to the emitter and the base, respectively, of the transistor, the three connection pins being intersected substantially throughout their length inside the envelope by a common plane of intersection, is characterized in that inside the envelope a screening conductor which is bent around the end portion of the collector pin supporting the semiconductor body and extends to between the collector pin and the other further connection pin, is connected to one of the further connection pins as a result of which the free end of the screening conductor forms the intermediate part of the one further connection pin.

As already stated, the invention may advantageously be applied to semiconductor devices having an envelope of synthetic material, the semiconductor body with a part of the connection pins, being embedded in said synthetic material. Alternatively, however, an envelope may be used, the space of which contains a gas and the walls of the envelope consist of an electrically insulating material.

The invention further relates to a circuit arrangement comprising a semiconductor device according to the invention which circuit arrangement is characterized in that the one further connection pin is common for the input circuit and the output circuit, the input signals being applied to one of the two connection pins constituted by the other further connection pin and the supporting connection pin, and the output signals being derived from the other of the said two connection pins.

In order that the invention may readily be carried into effect, certain embodiments thereof will now be described in greater detail, by way of example, with reference to the accompanying drawings, in which:

FIG. 1 diagrammatically shows a plan view of an embodiment of a semiconductor device according to the invention, which is accommodated in a circuit arrangement according to the invention, in which, for showing the structure inside the envelope, the envelope is not shown while the wall of the envelope is denoted diagrammatically only by a dot-and-dash line.

Figure 2:
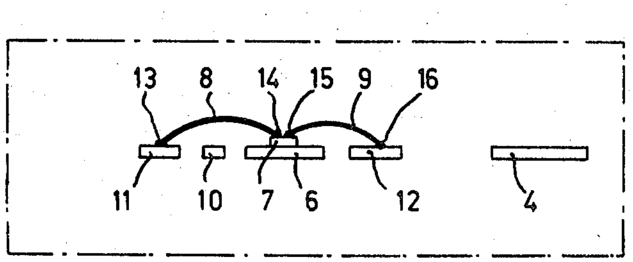

FIG. 2 diagrammatically shows a cross-sectional view of the said semiconductor device taken on the line II—II of FIG. 1.

Figure 3:
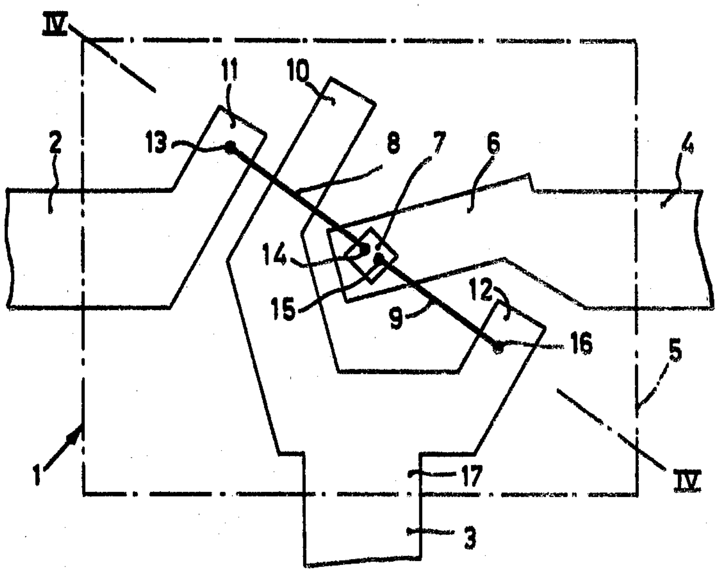
Figure 4:
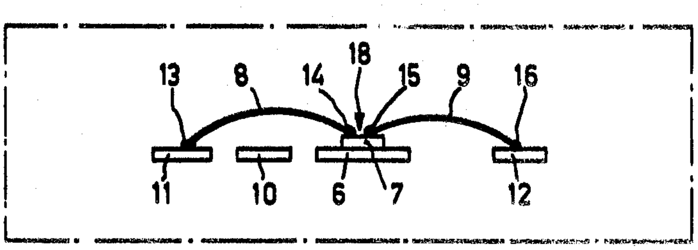
Figure 5:
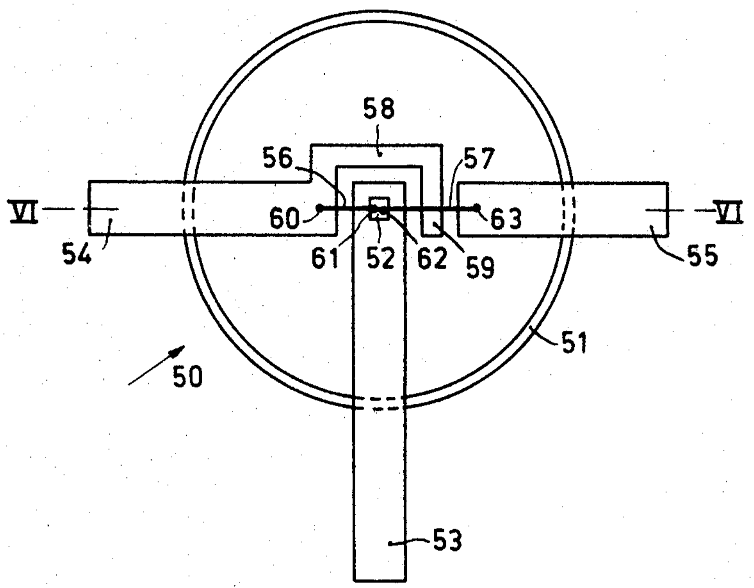
Figure 6:
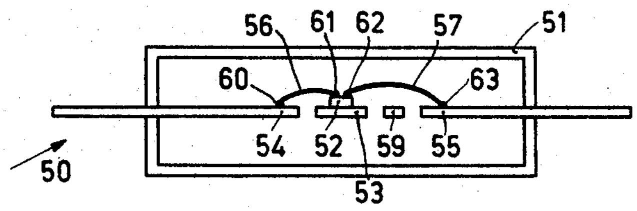
Figure 7:
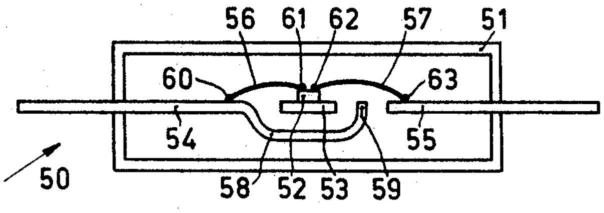
Figure 8:
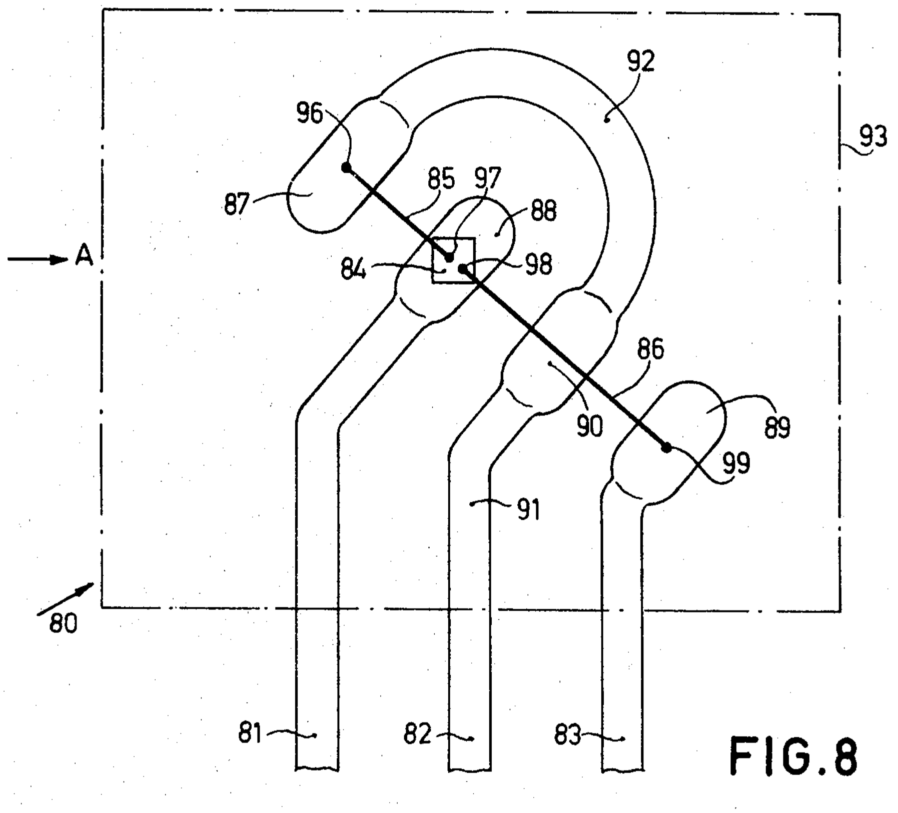
Figure 9:
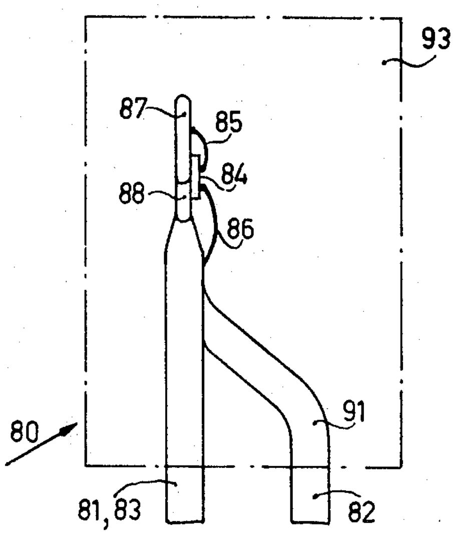
Figures 10, 11, 12, 13, 14:
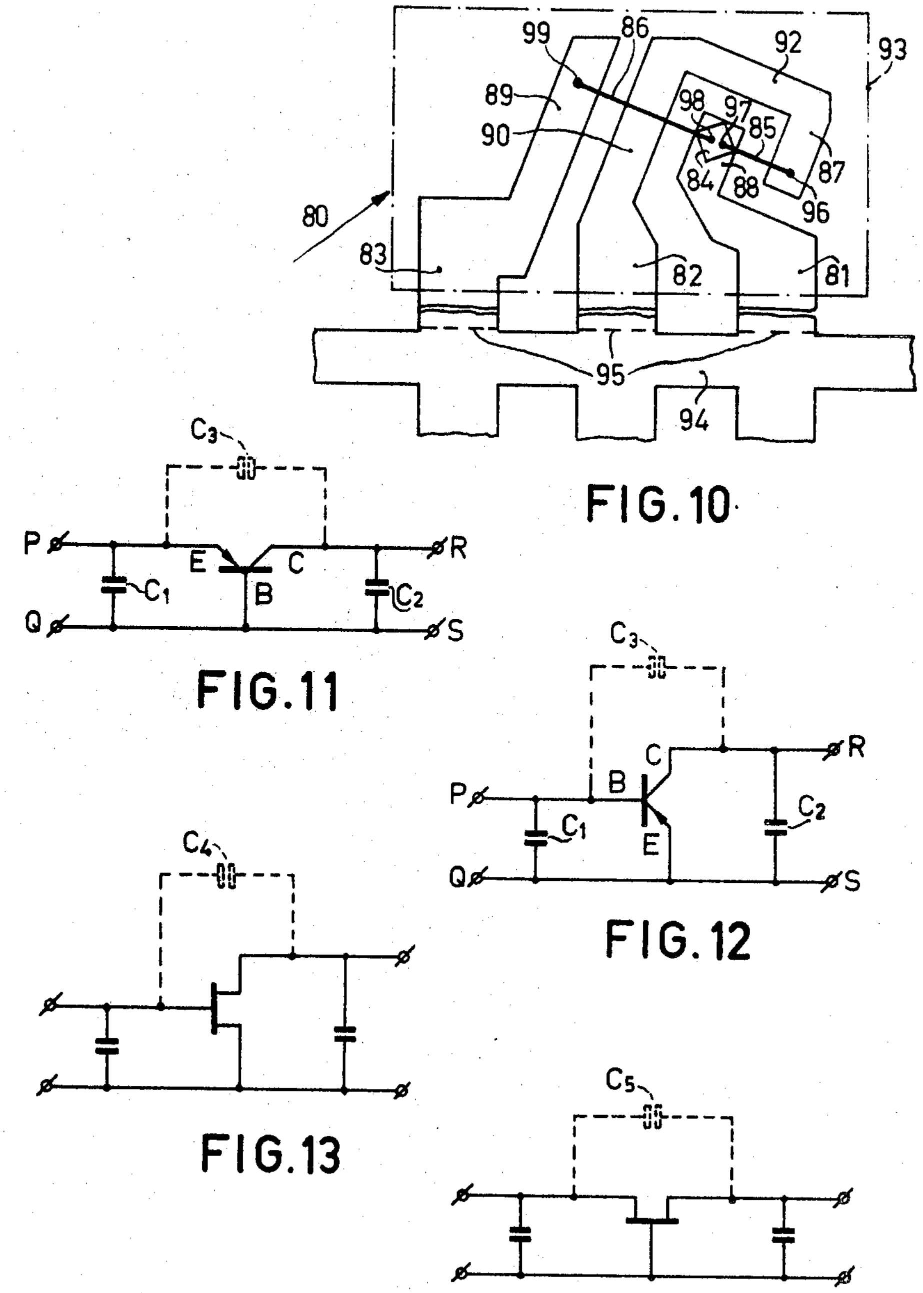

FIGURE 3 diagrammatically shows a plan view of another embodiment of a semiconductor device according to the invention in which the wall of the envelope is shown diagrammatically only by a dot-and-dash line and of which FIG. 4 diagrammatically shows a sectional view taken on the line IV—IV of FIG. 3, FIG. 5 diagrammatically shows the plan view of a third embodiment of a semiconductor device according to the invention in which the upper side of the envelope is removed to show the inner construction of the envelope and of which FIG. 6 diagrammatically shows a cross-sectional view taken on the line VI—VI in FIG. 5, FIG. 7 diagrammatically shows a similar cross-sectional view to FIG. 6 of an embodiment having a somewhat different construction, FIG. 8 diagrammatically shows a plan view of a further embodiment of a semiconductor device according to the invention, in which the wall of the envelope is diagrammatically shown by a dot-and-dash line, while FIG. 9 is a side elevation of this embodiment viewed in a direction which is denoted by the arrow A in FIG. 8, FIG. 10 diagrammatically shows a similar plan view to FIG. 8 of an embodiment having a somewhat different construction, FIGS. 11 to 14 are circuit diagrams of circuit arrangements according to the invention.

The semiconductor device 1 shown in FIGS. 1 and 2 comprises three connection pins 2, 3 and 4 which are passed through the wall 5 of an envelope while the semiconductor body 7 which is provided with electrodes is secured through one of its electrodes to an end portion 6 of the supporting connection pin 4, and two further electrodes 14 and 15 of the semiconductor body 7 are connected through connection conductors 8 and 9 to the two further connection pins 2 and 3 which extend to the proximity of the semiconductor body 7, the one connection pin 3 of the two further connection pins 2 and 3 comprising a part 10 which is located between the end portion 6 of the supporting connection pin 4 and a part 11 of the other further connection pin 2. According to the invention, the one further connection pin 3 comprises, in addition to the part 10 which electrically screens the parts 6 and 11 from each other, a second part 12 which is located opposite to the intermediate part 10 beside the end portion 6 of the supporting connection pin 4 and to which is secured the connection conductor 9 which connects the one further connection pin 3 to a further electrode of the semiconductor body 7. The two parts 10 and 12 are united inside the envelope.

The connection conductors 8 and 9 are approximately in alignment, the connection points 13 and 16 of these connection conductors 8 and 9 to the connection pins 2 and 3 and the further electrodes 14 and 15 of the semiconductor body 7 being located substantially on a common straight line. This is important because four connection points of two conductors 8 and 9 located substantially on a straight line can be manufactured by machines much more rapidly in general than in case the connection points would not be located on a common straight line. In FIGURE 1 the connection points lie on the line II—II. In FIGURE 2, the electrodes 14 and 15 are located somewhat above the line joining the connection points 13 and 16. The most important feature for the manufacture, however, is that the connection points, viewed in a direction at right angles to the largest cross-section of the semiconductor body 7 in FIGURE 1, in a direction approximately at right angles to the plane of the drawing are located substantially on a straight line.

The parts 10 and 12 of the connection pin 3 and the connection pins 2 and 4 are intersected by a common plane of intersection, in FIGURE 1 the plane of the drawing. The connection pins 2 to 4 further consist of metal strips the large surfaces of which extend substantially parallel to the common plane of intersection. As a result of this, these connection pins can be manufactured simultaneously from one metal sheet.

The connection pins 2 to 4 are passed through the wall of the envelope substantially in the same direction, the one further connection pin 3 being divided inside the envelope into two branches, one branch containing the intermediate part 10 and the other branch comprising the second part 12, the supporting connection pin 4 being bent around the second part 12 of the other branch, the end portion 6 of the supporting connection pin 4 being located between the two parts 10 and 12 of the one further connection pin 3. The part 17 of the one further connection pin 3 which is passed through the wall of the envelope and is not associated with the branches is located between the supporting connection pin 4 and the other further connection pin 2. In this configuration the connection pins 2 and 4 are electrically screened from one another both by the part 17 of the connection pin 3 and by the part 10.

The semiconductor body 7 may be that, for example, of a planar transistor, a mesa-transistor or an alloy-diffusion transistor and may be manufactured, like the envelope, from the normal materials entirely in a manner commonly used in semiconductor technology. The connection conductors 8 and 9 may be connected, for example, by thermocompression bonding, to the vapor-deposited or alloyed base and emitter contacts 14 and 15, while the semiconductor body 7 is connected with the collector to the supporting connection pin 4, for example, by soldering and/or alloying.

In accordance with the fact whether the transistor is destined for use in common base or common emitter circuits, the base and the emitter, respectively, of the semiconductor body 7 will be connected, through the connection conductor 9, to the one further connection pin 3, while then the emitter and the base, respectively, of the semiconductor body 7 are connected, through the connection conductor 8, the other further connection pin 2.

As envelopes may be employed the commonly used types of envelopes, for example, hermetically sealed envelopes in which the connection pins which are passed through the wall of the envelope are insulated electrically from the metal part of the wall, for example, by means of glass. In the present example, the envelope consists of synthetic material. The semiconductor body 7 of the transistor is embedded in the synthetic material while the connection pins 2 to 4 project from this synthetic material only partly and the envelope consists exclusively of this synthetic material, and in which the screening conductor 10 which is connected to the one further connection pin 3 and which extends between the other further connection pin 2 and the collector pin 4 is entirely located inside the envelope of synthetic material. The wall 5 of the envelope is constituted by the surface of the embedding of synthetic material. The connection pins 2 to 4 inside the envelope of synthetic material extend beside each other from the surface 5, the one further connection pin 3 being located between the other further connection pin 2 and the collector pin 4. The collector pin 4 is bent around the extremity 12 of the one further connection pin 3, the end portion 6 of the collector pin which supports the semiconductor boody 7 being located between the two further connection pins 2 and 3, the screening conductor 10 extending from the one further connection pin 3 to between the end portion 6 of the collector pin 4 and the other connection pin 2.

The envelope may consist, for example, of a thermosetting or a thermoplastic plastic or another synthetic material which is commonly used for this purpose. If desired, the envelope of synthetic mateiral may alternatively be constructed from layers or different synthetic materials. The dimensions of the envelope of synthetic material are, for example, 7 x 5 x 4 mm.

The connection conductors 8 and 9 consist, for example, of aluminum wires having a diameter of approximately 20μ.

The connection pins 2 to 4 may consist of materials commonly used for connection pins, for example, an iron-cobalt-nickel alloy. The width of the connection pins 2 to 4 near the wall 5 of the envelope is, for example, approximately 1.2 mm. and the thickness of the metal strip is, for example, approximately 0.2 mm. The centre distance of two adjacent connection pins, for example, the pins 2 and 3 is approximately 2.5 mm. at the area where they are passed through the wall 5 of the envelope. The dimensions of the semiconductor body 7 may be approximately 0.4 mm. x 0.4 mm. x 100μ.

It is to be noted that experiments carried out in connection with the invention have proved that by means of the invention the possible amplification of a transistor having a configuration as shown in FIGURES 1 and 2 in an envelope of synthetic material as described above can easily be increased by 20 to 30%.

In the semiconductor device shown in FIGURES 3 and 4, corresponding components are denoted by the same reference numerals as in FIGURES 1 and 2. In this embodiment, the directions in which the supporting connection pin 4 and the further connection pins 2 and 3 are passed through the wall 5 of the envelope are parallel to the same plane and the direction in which the one further connection pin 3 is passed through the wall 5 of the envelope is approximately at right angles to the directions in which the supporting connection pin 4 and the other further connection pin 2 are passed through the wall 5 of the envelope.

Such a configuration is especially used for high frequencies, because only the ends of the connection pins 2 to 4 come in the proximity of each other so that the stray capacities between the connection pins are comparatively small. Nevertheless the invention makes a considerable improvement possible in this case also.

Inside the envelope the one further connection pin 3 is divided into two branches, one branch comprising the intermediate part 10 and the other branch comprising the second part 12, the end portion 6 of the supporting connection pin 4 extending to between the two branches and the other further connection pin 2 extending to beside the intermediate part 10.

The semiconductor body, the connection conductors, the connection pins and the envelope may be of the same construction as in the first embodiment.

For use at high frequencies this configuration is particularly suitable in combination with an envelope consisting of a wall of electrically insulating material, for example, glass, a synthetic material or a ceramic material, the space inside the envelope being filled with a gas.

A second embodiment of a semiconductor device according to the invention in which the connection pins are not passed through the wall of the envelope in the same direction will now be described with reference to FIGURES 5 and 6. This embodiment relates to a transistor 50 having a connection pin 53, the collector pin, passed through the wall 51 of the envelope on which pin in the proximity of its extremity the semiconductor body 52 is secured through the collector and in which two further connection pins 54 and 55 are passed through the wall 51 of the envelope and extend approximately in opposite directions from the wall 51 to the proximity of the end of the collector pin 53 and which are connected by connection conductors 56 and 57 to the emitter and the base of the transistor. Inside the envelope the three connection pins 53, 54 and 55 have a common plane of intersection, substantially throughout their length and a screening conductor 58 is connected inside the envelope to the one further connection pin 54, which conductor 58 is bent around the end portion of the collector pin 53 supporting the semiconductor body 52 and extends to between the collector pin 53 and the other further connection pin 55 so that the free exertmity of the screening conductor 58 constitutes the intermediate part 59 of the one further connection pin 54.

In this embodiment also, the connection points 60 to 63 are substantially located on a straight line, in FIGURE 5 the line VI—VI.

The screening conductor 58 may alternatively consist of an elongation of the connection pin 54 which is bent below the collector pin 53. In that case, the cross-section shown in FIGURE 7 is obtained instead of the cross-section shown in FIGURE 6. This latter embodiment, however, is somewhat more difficult to realize because the connection pins are no longer located approximately in one plane. If the connection pins are constructed in the form of metal strips, they consequently can no longer be manufactured simultaneously from one flat metal sheet.

The envelope consists, for example, of a circular box of insulating material, for example, ceramic material, the two halves of which, which comprise recesses in the edges for the connection pins 53 to 55, are secured together by gluing after the interposition of the connection pins. The diameter of the envelope is, for example, approximately 4 mm. and the height approximately 1.5 mm.

For the rest, this transistor can entirely be manufactured in a manner already described and with the materials already described.

FIGURES 8 and 9 relate to a transistor 80 according to the invention in which the connection pins 81 and 83 are manufactured from metal wires. The filamentary connection pins 81 to 83 are flattened at the area where the semiconductor body 84 and the connection conductors 87 and 86 are secured thereto, the large connection surfaces of the flattened parts 87 to 89 being substantially located in one plane, in FIGURE 8 in the plane of the drawing.

These rod-shaped or wire-shaped connection pins will be used, for example, when the semiconductor device is destined to be incorporated in a circuit arrangement by means of the commonly used types of sockets having circular contact sleeves. The diameter of the metal wires is for example, approximately 0.4 mm. and they are manufactured, for example, from nickel.

According to the invention, the intermediate part 90 of the one further connection pin 82 comprises on one side an extension 91 which is passed through the wall 93 of the envelope and on the opposite side an extension 92 which is intersected entirely by the common plane of intersection, in FIGURE 8 that plane of the drawing, and which is bent around the end portion 88 of the supporting connection pin 81 thus also constituting the second part 87 of the one further connection pin 82.

It will be obvious that in this case a satisfactory screening is obtained in a particularly simple manner. The elongation 92, 87 of the one further connection pin 91 makes a separate screening conductor superfluous so that branching of the one further connection pin is no longer necessary.

It is shown in FIGURE 9 that in the present embodiment the connection pins 81 to 83 do not have a common plane of intersection throughout their length inside the wall 92 of the envelope of the transistor 80. The one further connection pin 82 is curved so that the connection pins 81 to 83 outside the envelope are not located in one plane.

This curvature may take place both outside and inside the envelope. In the latter case, however, it will be effected preferably as near to the wall 93 of the envelope as is possible, to keep the screening action of the one further connection pin 82 as large as possible.

Such a curvature will be used, for example, when the semiconductor device is destined for being incorporated in a circuit arrangement via the commonly used types of sockets in which the contact sleeves are not located on a straight line.

FIGURE 10 shows a somewhat different embodiment in which corresponding components are denoted by the same reference numerals as in FIGURE 8. The connection pins 81 to 83 in this embodiment are metal strips, for example, approximately 0.2 mm. thick, while the width of the strips at the area where they are passed through the wall 93 of the envelope, is, for example, approximately 1.2 mm. The centre distance of two connection pins located beside each other, for example, 81 and 82, is, for example, approximately 2.5 mm. at the area where they are passed through the wall 93 of the envelope. Initially the connection pins 81 to 83 are integral with the connection strip 94 which is removed in a subsequent stage of the manufacture, after breaking or cutting along the broken line 95.

The two latter examples of semiconductor devices may further be manufactured from the conventional materials in an entirely normal manner. The connection conductors may consist, for example, of gold wires, having a diameter of approximately $25/\mu$, while the connection pins may be gold-plated, for example. The connection points 96 to 99 may be obtained, for example, by thermo-compression bonds or by ultrasonic welding.

The two latter configurations are also suitable for use in envelopes of synthetic material, as a result of which cheaper transistors having a satisfactory screening are obtained.

The transistors 1, 50 and 80 may be incorporated in a circuit arrangement according to the invention in a manner already shown diagrammatically in FIGURE 1. The input circuit and the output circuit are denoted only diagrammatically in this figure by the blocks 19 and 20, since the details thereof are of no further significance for the invention. The one further connection pin 3 of the conductor 1 is common in the circuit for the input circuit 19 and the output circuit 20 while the input signals are applied to the other further connection pin 2 and the output signals are derived from the supporting connection pin 4.

For clearness' sake such a circuit arrangement is shown diagrammatically once again in FIGURE 11, in which the transistor 1; 50; 80 is shown symbolically in normal manner while it is further assumed that the base B is common for the input circuit and the output circuit which are to be connected to the terminals P and Q and R and S, respectively. In FIGURES 1 to 10 this means that the one further connection pins 3; 54; 82 is connected, through the connection conductors 9; 65; 85, to the base electrodes of the semiconductor body 7; 52; 84 and the other further connection pin 2; 55; 83 is connected through the connection conductor 8; 75; 86 to the emitter electrode of the semiconductor body 7; 52; 84. So the circuit is a common base arrangement.

The capacities $C_1$ and $C_2$ are the capacities between the other further connection pin 2; 55; 83 and the one further connection pin 3; 54; 82 and that between the supporting connection pin 4; 53; 81 and the one further connection pin 3; 54; 82. These capacities $C_1$ and $C_2$ which are connected across the electric input and across the electric output of the transistor 1; 50; 80 are usually not annoying in practice.

If not sufficient precautions are taken to obtain a good screening a capacity $C_3$ will occur between the collector C and the emitter E instead of at least a part of the capacities $C_1$ and $C_2$. This capacity $C_3$ which in FIGURE 11 is denoted by broken lines in FIGURES 1 to 10 is the capacity between the other further connection pin 2; 55; 83 and the supporting connection pin 4; 53; 81, if these connection pins are not screened from one another or are insufficiently screened from one another. The capacity $C_3$ causes feedback coupling between the output circuit and the input circuit as a result of which, for example, the possible amplification of such a circuit is restricted.

In a circuit arrangement according to the invention in which a semiconductor device according to the invention is used, the harmful capacity $C_3$ is reduced considerably in a simple manner or is even removed while the nonharmful capacities $C_1$ and $C_2$ are increased.

In addition to a common base arrangement, for example, also a common emitter circuit is possible, see FIGURE 12. This circuit may be derived from the comon base arrangement described by changing the base electrode and the emitter electrode of the semiconductor body 7; 52; 84.

It is to be noted that in circuit arrangements as shown in FIGURE 11 a reference potential, for example, earth or the mass of the apparatus in which the circuit arrangement is incorporated is usually set up at the base, and in circuit arrangements as shown in FIGURE 2 at the emitter.

As already stated, the invention is not restricted to transistors. For example, the semiconductor body 7 in FIGURES 1 and 2 may be that of a field-effect transistor in which the semiconductor body 7 is secured to the supporting connection pin 4 through the gate electrode which forms a p-n junction with the channel region. The source electrode and the drain electrode are connected through the connection conductors 9 and 8, respectively, to the one further connection pin 3 and the other connection pin 2. In a circuit arrangement the capacity $C_4$ shown in FIGURE 13 by broken lines is substantially entirely avoided in the manner already described.

The semiconductor body 84 in FIGURES 8 to 10 may be, for example, that of a field-effect transistor of the type having an insulated gate electrode in which the source electrode is short-circuited with the surrounding part of the semiconductor body, through which surrounding part the semiconductor body 84 is secured to the supporting connection pin 81. The insulated gate electrode and the source electrode are connected, through the connection conductors 85 and 86, respectively, to the one further connection pin 82 and the other further connection pin 83. The capacity $C_5$ shown in FIGURE 14 is avoided in a circuit arrangement in the manner already described.

In the two last embodiments the input signals in a circuit arrangement according to the invention are applied to the supporting connection pin 4; 81 while the output signals are derived from the other further connection pin 2; 83. In this case the one further connection pin 3; 82 is common for the input circuit and the output circuit.

It will be obvious that the invention is not restricted to the examples described and that many variations are possible to those skilled in the art without departing from the scope of this invention. The connection pins need not form one assembly but may be constructed, for example, from a part which is passed through the wall of the envelope to which a following part is connected inside the envelope, for example, by welding or soldering, if required at an angle with the first-mentioned part. The envelopes may have any desired shape. The envelope of synthetic material need not be rectangular but may be disc-shaped or spherical. In order to obtain a better screening, the screening part 10; 59; 90 may have a larger area at right angles to the plane of the drawing of FIGURES 1, 3, 5, 8 and 10 than that of the connection pins 2, 4; 53, 55; 81, 83; for example, the strip 10 in FIGURES 1, 3 may be twisted somewhere, so that the strip 10, at least through part of its length, extends with its width at right angles to the plane of the drawing instead of parallel thereto. However, in many cases the strip 10, in the form as shown in FIGURES 1 and 3, will already provide a satisfactory screening. In the configuration shown in FIGURES 3 and 5 it may be desirable, for example, not to pass the connection pins 2; 54 and 4; 55 accurately in opposite directions through the walls of the envelope, but, for example, in such manner that they enclose an angle of approximately 120° with one another. Alternatively, for example, the part 10 in FIGURE 3 may be elongated and this elongation may be passed through the wall 5 of the envelope as a fourth connection pin in a direction opposite to that of the connection pin 3. The one further connection pin 3 then has a double construction, as a result of which the electric input circuit and the electric output circuit in a circuit arrangement which comprises such a semiconductor device can be better separated from one another.

What is claimed is:

1. A semiconductor device comprising an envelope, a semiconductor body having at least three electrode regions disposed within said envelope, at least three mutually insulated connection pins extending through the envelope wall forming exterior portions for connection in a circuit and interior portions for connection to the electrode regions, said semiconductor body being mounted via a first electrode region on an interior end portion of a first supporting connection pin, a first connection conductor interconnecting an interior end portion of a second connection pin and a second electrode region, a second connection conductor interconnecting an interior end portion of a third connection pin and a third electrode region, said interior end portions of the second and third connection pins extending to the proximity of the semiconductor body, one of said second and third connection pins having a first intermediate part extending on one side of the first connection pin end portion and between the latter and the end portion of the other of said second and third connection pins and providing an electrical screening effect therebetween, said one connection pin having integral with the first part a second part extending along the opposite side of the first connection pin end portion, the connection point of said connection conductor to said one connection pin being made along said second part thereof.

2. A semiconductor device as set forth in claim 1 wherein the connection points of the first and second connection conductors to the second and third connection pins and the second and third electrode regions, when viewed in a direction approximately at right angles to the largest cross-section of the semiconductor body, are located substantially on a straight line.

3. A semiconductor device as set forth in claim 2 wherein all of the connection pin end portions including the first and second parts of said one connection pin extend substantially in a common plane.

4. A semiconductor device as set forth in claim 3 wherein the entire lengths of the connection pins extend in a common plane.

5. A semiconductor device as set forth in claim 1 wherein the connection pins are in the form of wires with flattened end portions or metal strips.

6. A semiconductor device as set forth in claim 1 wherein the exterior connection pin portions are parallel to one another and in the same plane.

7. A semiconductor device as set forth in claim 6 wherein the exterior connection pin portions are arranged in the following order: first connection pin, said one of the second and third connection pins, the other of said second and third connection pins.

8. A semiconductor device as set forth in claim 7 wherein said one connection pin interior portion has a generally U-shaped end with the arms of the U constituting the first and second parts, the interior end portion of said first connection pin extending around the second part and into the U.

9. A semiconductor device as set forth in claim 7 wherein said one interior connection pin portion has a generally U-shaped end with the arms of the U constituting the first and second parts, the interior end portion of said first connection pin extending directly into the U.

10. A semiconductor device as set forth in claim 1 wherein the exterior connection pin portions extend radially from the envelope.

11. A semiconductor device as set forth in claim 10 wherein said one interior connection pin portion has a generally U-shaped end with the arms of the U constituting the first and second parts, the interior end portion of said first connection pin extending directly into the U.

12. A semiconductor device as set forth in claim 1 wherein the end portions of all the interior connection pin portions extend substantially parallel to one another and in the same plane.

13. A circuit arrangement comprising a semiconductor device as set forth in claim 1 wherein the first electrode region is a transistor collector, the second electrode region is a transistor emitter, and the third electrode region is a transistor base, and means are provided for reverse biasing the collector and for forward biasing the emitter.

14. A circuit arrangement as set forth in claim 13 wherein means are provided for supplying input signals to the said other connection pin and for deriving output signals from said first connection pin, and means are provided for connecting said one connection pin common to said input and output.

15. A circuit arrangement comprising a device as set forth in claim 1 and including an input and an output circuit, said input circuit including said other connection pin, said output circuit including said first connector pin, said one connection pin being common to said input output circuits.

16. A circuit arrangement comprising a device as set forth in claim 1 and including an input and an output circuit, said input circuit including said first connection pin, said output circuit including said other connector pin, said one connection pin being common to said input and output circuits.

References Cited

UNITED STATES PATENTS

| | | | |
|---|---|---|---|
| 2,903,630 | 9/1959 | Cohen et al. | 317—235 |
| 2,985,806 | 5/1961 | McMahon et al. | 317—235 |
| 3,171,187 | 3/1965 | Ikeda et al. | 29—25.3 |
| 3,264,712 | 8/1966 | Hayashi et al. | 29—155.5 |

JOHN W. HUCKERT, Primary Examiner

J. R. SHEWMAKER, Assistant Examiner

U.S. Cl. X.R.

317—234